United States Patent
Li (10) Patent No.: US 9,377,511 B2
(45) Date of Patent: Jun. 28, 2016

(54) COVERAGE ENHANCEMENT AND POWER AWARE CLOCK SYSTEM FOR STRUCTURAL DELAY-FAULT TEST

(71) Applicant: Infineon Technologies AG, Neubiberg (DE)

(72) Inventor: Zhen Song Li, Singapore (SG)

(73) Assignee: Infineon Technologies AG, Neubiberg (DE)

( * ) Notice: Subject to any disclaimer, the term of this patent is extended or adjusted under 35 U.S.C. 154(b) by 39 days.

(21) Appl. No.: 14/083,624

(22) Filed: Nov. 19, 2013

(65) Prior Publication Data

US 2015/0143189 A1 May 21, 2015

(51) Int. Cl.
*G01R 31/28* (2006.01)
*G01R 31/3185* (2006.01)

(52) U.S. Cl.
CPC *G01R 31/318575* (2013.01); *G01R 31/318541* (2013.01); *G01R 31/318552* (2013.01)

(58) Field of Classification Search
CPC ............ G01R 31/318541; G01R 31/3177; G01R 31/31858; G01R 31/318552; G01R 31/318547; G01R 31/31727; G01R 31/31725; G01R 31/318594; G01R 31/318558; G01R 31/318536; G01R 31/318575; G01R 31/318591; G01R 31/318566; G11C 29/32; G06F 11/2733
See application file for complete search history.

(56) References Cited

U.S. PATENT DOCUMENTS

| | | | |
|---|---|---|---|
| 6,880,137 B1 * | 4/2005 | Burlison et al. | 714/724 |
| 8,055,965 B2 | 11/2011 | Kaneko | |
| 9,026,875 B2 * | 5/2015 | Wang | G01R 31/31704 714/731 |
| 2002/0162065 A1 | 10/2002 | Kashiwagi | |
| 2005/0138511 A1 * | 6/2005 | Benware | 714/727 |
| 2006/0179376 A1 * | 8/2006 | Asaka | 714/731 |
| 2006/0282727 A1 * | 12/2006 | Hoshaku | 714/726 |
| 2008/0282122 A1 * | 11/2008 | Guettaf | 714/731 |
| 2009/0003424 A1 * | 1/2009 | Waayers et al. | 375/226 |
| 2010/0138709 A1 * | 6/2010 | Wang et al. | 714/731 |
| 2010/0306607 A1 | 12/2010 | Kaneko | |
| 2010/0332928 A1 * | 12/2010 | Li et al. | 714/731 |
| 2011/0296265 A1 * | 12/2011 | Rakheja et al. | 714/731 |
| 2012/0173943 A1 * | 7/2012 | Cesari | 714/731 |
| 2013/0205180 A1 * | 8/2013 | Sato et al. | 714/727 |
| 2013/0254609 A1 * | 9/2013 | Yonetoku et al. | 714/729 |
| 2015/0052411 A1 * | 2/2015 | Cesari | 714/727 |

FOREIGN PATENT DOCUMENTS

JP    2013-156073    8/2013

* cited by examiner

*Primary Examiner* — Guerrier Merant
(74) *Attorney, Agent, or Firm* — Eschweiler & Associates, LLC

(57) ABSTRACT

Methods and devices applying to a clock system of scan circuits to enhance the test coverage for structural delay-fault tests are provided. According to an aspect, a method applying to a clock system of a scan circuit of a scan test containing one or more clock gating cells includes at any stage of the scan test outputting a controllable waveform of a clock signal at each clock gating cell, and eliminating a partially enabled clock signal during a capture cycle at each clock gating cell.

19 Claims, 6 Drawing Sheets

COVERAGE ENHANCEMENT AND POWER AWARE CLOCK SYSTEM FOR STRUCTURAL DELAY-FAULT TEST

FIELD

The present disclosure relates to a scan circuit, a clock gating cell, and a method applying to a clock system of a scan circuit, e.g., used during structural delay-fault test. More particularly, some embodiments relate to keeping clock signals controllable even if partially controllable or uncontrollable logic is present in the scan circuit. Further embodiments relate to reducing power consumption during a test phase.

BACKGROUND

The tremendous progress in the development of integrated circuits (ICs; chips, microchips, electronic circuits etc.) over the last decades has scaled down the relevant scales for design structures to the submicron and even to the nanometer regime. Hereinafter, "integrated circuit", e.g., is related to digital integrated circuits that contain a set of digital electronic circuits including logic gates, flip-flops, multiplexers and other circuits. Such small structures, on one hand, in combination with an increase in the complexity of the total design, on the other, makes it a very challenging task for semiconductor companies to reduce the defects in their chips. In order to reduce the development costs of integrated circuits, companies subject their products to scan tests. The smaller the structures get, the more difficult it is to obtain a high test coverage, which, in turn, implies a higher quality of the product. Submicron and nanometer structures not only do suffer from functional defects (e.g., shorts or opens in the device interconnect), but, in particular, from timing-related delay defects (such as high-impedance shorts, in-line resistance, cross-talk between signals). While the former can effectively be detected in static tests (e.g., stack-at fault model and IDDQ fault model) the latter can be accessed only through at-speed tests. Available automatic test pattern generation (ATPG) tools are able to deal with delay defects. Typically, at-speed fault models (e.g., transition delay fault models using the launch-off-shift or skewed-load method, transition delay fault models using the launch-off-capture or broadside method, path delay fault model, to name some of frequently used at-speed tests) consist of two parts: during the first part, a logic transition to be verified is launched, while in the second part the response is captured one application period after (hereinafter referred to as "capture cycle"), the application period being, e.g., identical to the clock period.

Any of the aforementioned test models become ineffective and lead, consequently, to a low test coverage, once a test circuit of an integrated circuit includes uncontrollable or partially controllable logics. Many chip manufacturers incorporate in their chip design, e.g., so-called intellectual property (IP) modules, the behavior of which is only well known during functional operation, while it is not during test operation. Such uncontrollable or partially controllable logics may lead to uncontrollable or partially controllable output signals during test operation, forcing the number of accessible test vectors to be strongly constrained, leading to a low test coverage. In the previous art related to structural at-speed delay-fault tests, such an issue has not yet been addressed.

SUMMARY

A purpose of the present disclosure inter alia may be directed to an improvement in test coverage by circumventing the problems caused within a clock system of a delay-fault test by uncontrollable or partially controllable logics.

A method applying to a clock system of a scan circuit of a scan test containing one or more clock gating cells is provided. The method comprises at any stage of the scan test outputting a controllable waveform of a clock signal at each clock gating cell, and eliminating a partially enabled clock signal during a capture cycle at each clock gating cell.

Further, a clock gating cell is provided. The clock gating cell is adapted to, during a capture cycle of a structural delay-fault scan test, output a controllable waveform of a clock signal, and eliminate a partially enabled clock signal during a capture cycle of the test.

BRIEF DESCRIPTION OF THE DRAWINGS

The accompanying drawings are included to provide a further understanding of the present disclosure and are incorporated in and constitute a part of this specification. The drawings illustrate embodiments of the present disclosure and together with the description serve to explain the principles of the disclosure. Other embodiments of the present disclosure and many of the intended advantages of the present disclosure will be readily appreciated, as they become better understood by reference to the following detailed description.

DETAILED DESCRIPTION

The low coverage of structural at-speed delay-fault tests in scan circuits is a well-known issue. Many integrated circuits include uncontrollable or partially controllable logics like, e.g., so-called intellectual property (IP) modules, non-scan flip-flops, embedded memories and "black boxes", the behavior of which depends on the individual functional implementation. While those uncontrollable or partially controllable logics exhibit a well-known behavior during functional, non-test operation, their behavior during scan test is, in general, not accessible beforehand. This is because of the large number of test vectors during scan test which cover a larger parameter space than accessible during functional operation. It is this uncontrollable or partially controllable behavior of some logic in scan circuits that reduces dramatically the test coverage.

During structural at-speed delay-fault tests (transition delay-fault test, path delay-fault test to name the two most important ones, without providing an exhaustive list) it is important to maintain an undistorted clock signal during the test's capture cycle at the output of each clock gating cell that might, e.g., be connected to a partially controllable or uncontrollable logic circuit. The partially controllable or uncontrollable signals at an output of partially controllable or uncontrollable logic may cause partial-enable signals of a clock signal at an input of a clock gating cell. The possibly resulting distorted clock signal at the output of the clock gating cell is henceforth denoted by "partially enabled clock signal". (In the following, the term "signal" is used which might include, without being exhaustive, frequency, pulse, etc. and other expressions that are well known to a person skilled in the art.) Without maintaining a controllable clock signal, an automatic test pattern generation (ATPG) tool is not able to define a clock signal at the output of the clock gating cell. This is one reason for inaccurate tests and, consequently, low test coverage. On the other hand, during scan test many flip-flops may switch without being relevant for the path being tested. This causes an elevated power consumption during the scan test. The problems are summarized in FIG. 1: this figure relates to a system on a chip (SoC) 1 including two clock domains. fast_clk_o denotes the fast or master clock terminating at a clock gating cell's 2a, 2b, 2c, 2d clock path (CP) input. The clock signals are provided by a Clock Control Unit 3. fast_clk_en_o and slow_clk_en_o are, respectively, the fast and slow clock enable (EN) signals which control the clock gating cell 2a, 2b, 2c, 2d at the input EN. The clock gating cell (CG) might be composed of, without being exhaustive, one or several flip-flops, one or several multiplexers, one or several logic gates. Possible forms of the clock gating cell's output (CPEN) are shown as cases 1, 3, 5 and 7: only waveforms in case 1 and case 5 are desirable during at-speed capture cycle of the scan test. Case 3-1 displays one example of a partially enabled clock signal, the case where a fast clock turns into a slow clock causing faults appearing in fast domain being tested in the slow domain (leading to inaccurate test coverage). In cases 3-2 and 3-3 more examples of partially enabled clock signals are shown: clock pulses are missing which causes an inefficiency of the ATPG tool because the latter being unable to define a clock signal and, hence, resulting in a low test coverage. The partially enabled clock signal of case 7-1 corresponds to a slow clock turning into a fast clock, i.e., faults appearing in the slow domain are tested in the fast domain (causing inaccurate test coverage). The cases 7-2 and 7-3 display partially enabled clock signals with missing clock pulses, causing, in analogy to cases 3-2 and 3-3, an inefficiency of the ATPG tool and, hence, low test coverage. The undesired waveforms 3-1, 3-2, 3-3 and 7-1, 7-2, 7-3 result from the Functional Control 5b and 5d, respectively, that is only controllable during functional, non-test, operation, but which might be uncontrollable during scan test.

Figure 1:
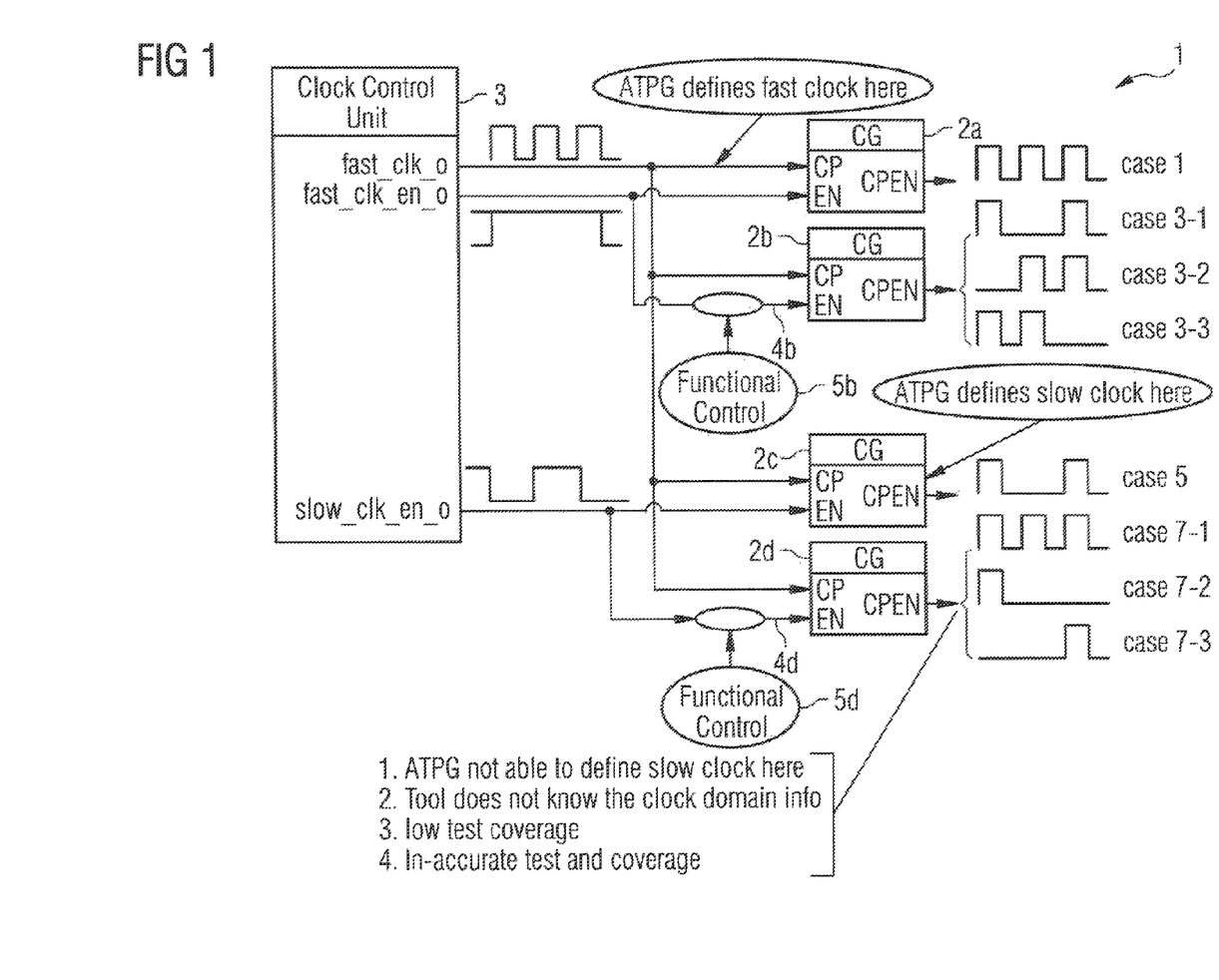
FIG. 1 depicts a system-on-a-chip (SoC) clock system with two clock domains including possible waveforms of the clock signal during capture cycle.

It is implied that FIG. 1 shows only a limited and simplified selection of all possible clock-signal related problems during scan test. A person skilled in the art will, however, be able to generalize them to many more involved issues related to the same subject.

A method according to an embodiment of the present disclosure is directed to the elimination of undesired waveforms (for instance, some of which are depicted in FIG. 1, the partially enabled clock signals of cases 3-1, 3-2, 3-3, 7-1, 7-2, 7-3) at the output CPEN of individual clock gating cells CG, allowing for the definition of one or more controllable clock signals by the ATPG tool. The undesired waveforms might be caused by partial enable signals 4b, 4d at one input (EN) of a clock gating cell, stemming, e.g., from uncontrollable or partially controllable logic circuits 5b, 5d. This method might be amended by a power consumption control of each of the clock gating cells.

Figure 2:
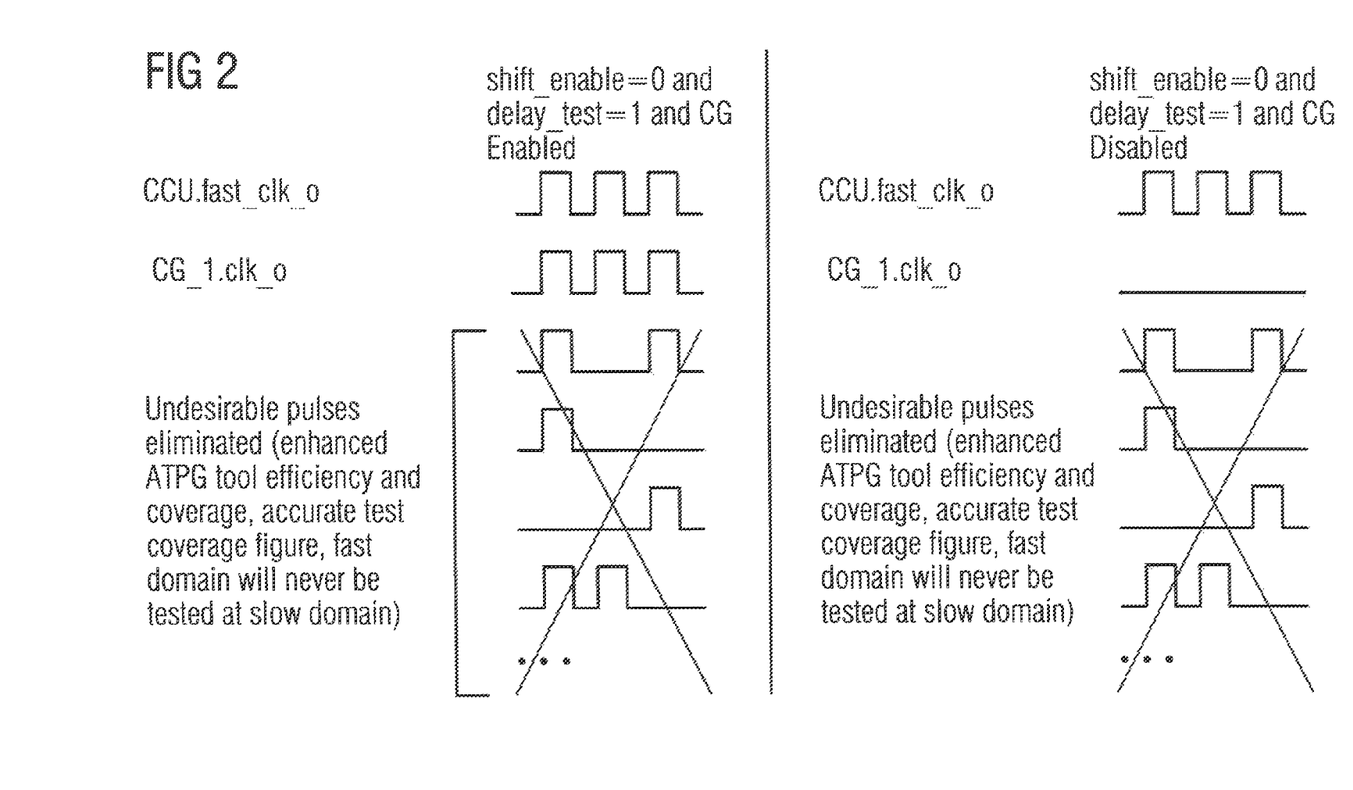
FIG. 2 depicts a desired waveform at capture cycle during delay-fault test for fast/master clock domain.
Figure 3:
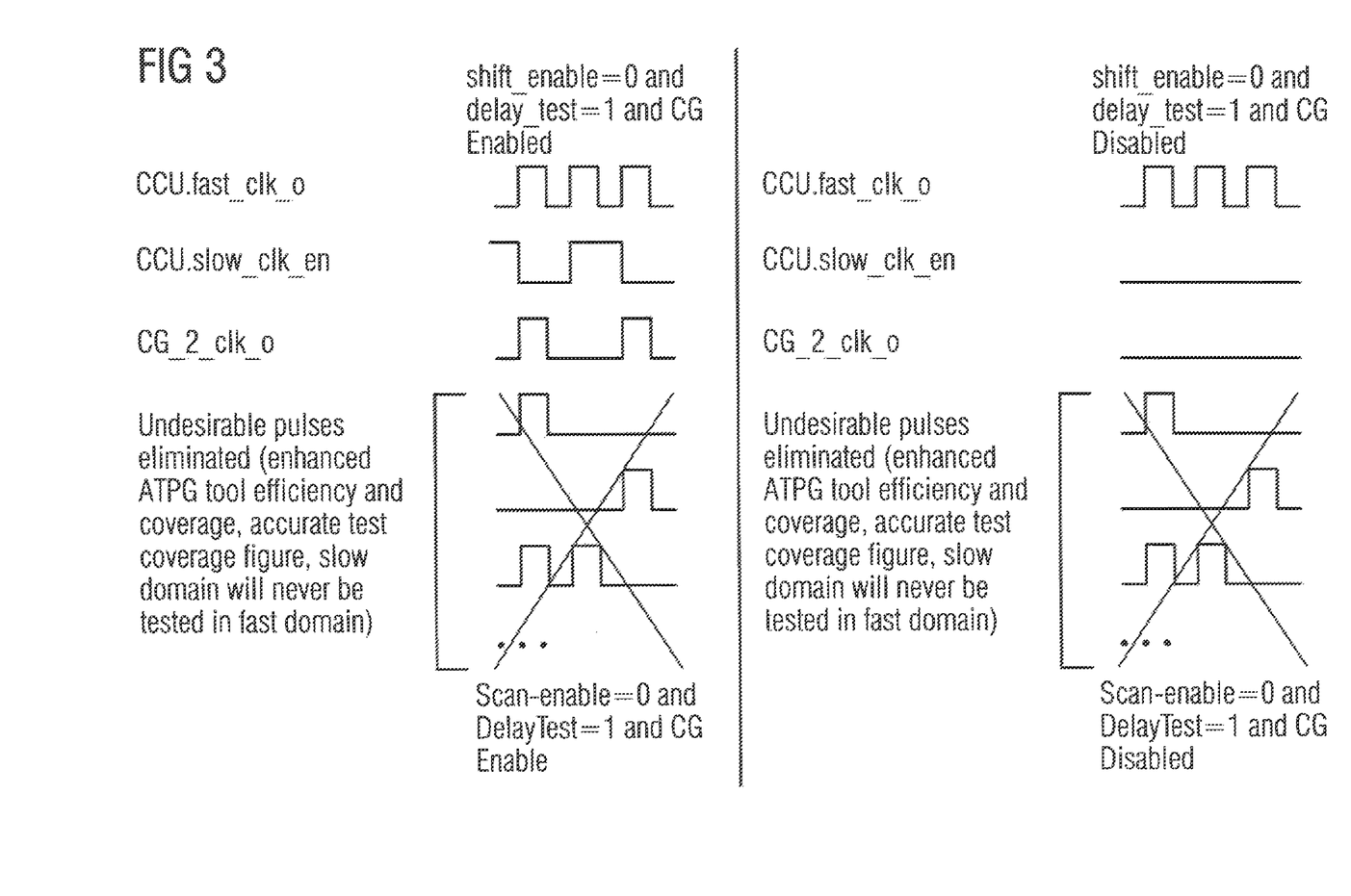
FIG. 3 depicts a desired waveform at capture cycle during delay-fault test for slow/divided clock domain.

The impact of the present method on the design of clock gating cells is shown in FIG. 2 and FIG. 3 for operation in the fast/master or slow/divided clock regime, respectively. The output signals CG_1.clk_o and CG_2.clk_o, although exemplarily shown for the embodiments referred to in FIG. 4 and FIG. 5, respectively, are obviously not limited to the embodiments but serve as general examples. In both figures, CCU.fast_clk_o denotes the application clock, which might be, but is not limited to, the system clock signal.

The left panel of FIG. 2 shows the waveform of the signal CG_1.clk_o, e.g., during the capture cycle of a delay-fault test for the fast/master clock regime at the output of one of the clock gating cells in the case of a turned on clock gating cell (CG Enabled) together with some of the eliminated waveforms, e.g., of unwanted partially enabled clock signals: in this case, the clock gating cell is completely transparent for the clock signal at the clock gating cell's input. In the right panel of FIG. 2, the clock gating cell is disabled (CG Disabled), and, consequently the OFF signal (CG_1.clk_o) appears at the clock gating cell's output.

FIG. 3 displays the waveform of the signal CG_2.clk_o, e.g., during the capture cycle of a delay-fault test for the slow/divided clock regime at the output of another of this disclosure's clock gating cell in the case of a turned on clock gating cell (CG Enabled, left panel) and in the case of a disabled clock gating cell (CG Disabled, right panel) together with some of the eliminated waveforms, e.g., of unwanted partially enabled clock signals. CCU.slow_clk_en is the slow-clock-enable signal that divides CCU.slow_clk_en according to the desired ratio (in FIG. 3 the ratio between CCU.slow_clk_en and CCU.slow_clk_en is chosen by way of example equal to 2). As in FIG. 2, the clock gating cell is completely transparent for the clock signal at the clock gating cell's input if the clock gating cell being set enabled (left panel). In the right panel, the clock gating cell is disabled (CG Disabled), and, consequently the OFF signal (CG_2.clk_o) appears at the clock gating cell's output.

The following two embodiments describe two exemplary digital circuits that lead to the above desired behavior. It should be understood, that all the signals that are described in the following, are not limited to the particular use in scan test, they are often referred to in the descriptions. A person skilled in the art will be able to adapt and apply the presented embodiments in circuits that are other than test circuits.

Figure 4A:
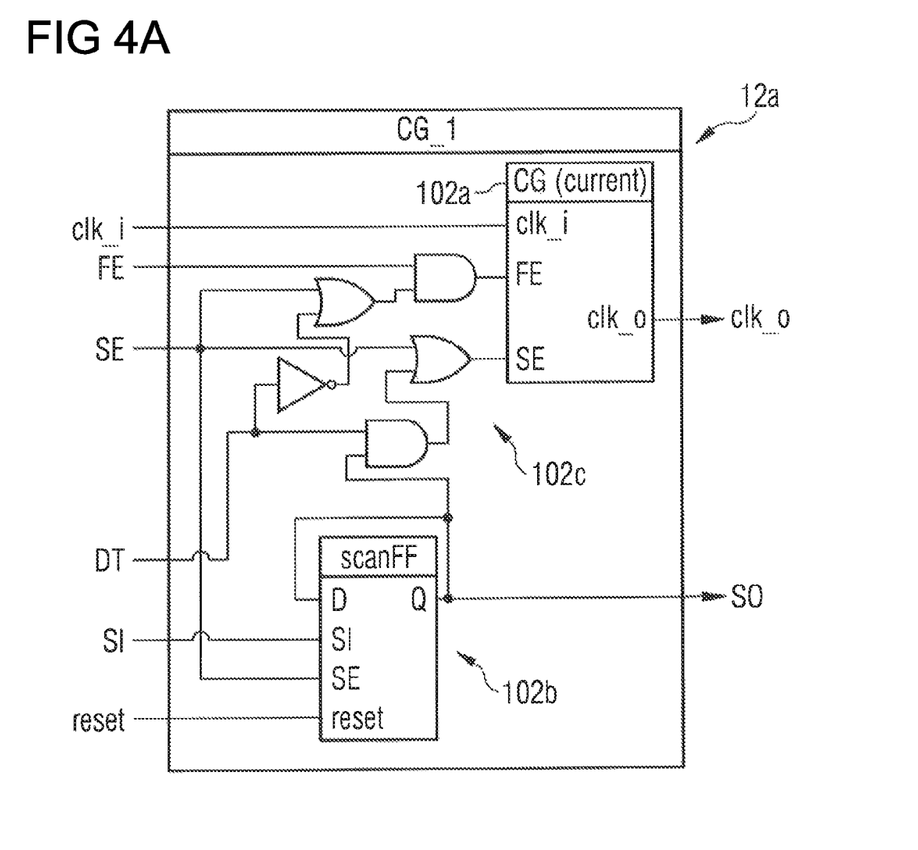
FIG. 4a depicts a first implementation example for an updated clock gating cell.

The updated clock gating cell 12a shown in FIG. 4a is composed of a clock gating cell 102a (CG (current)), a scan D flip-flop 102b (scanFF) and combinational logics 102c. The simplest realization of a clock gating cell CG (current) is provided by an AND gate. In the case considered here, one enable signal controls the clock signal clk_i. In the particular example of FIG. 4a, the clock gating cell 102a, CG (current) uses a first clock signal (clk_i), a functional-enable signal (FE) and a shift-enable signal (SE) as inputs. The output signal of the clock gating cell 102a, CG (current) is denoted by clk_o. For instance, the signal clk_i might be, but is not limited to, the fast/master clock signal during functional, non-test, operation, the fast/master clock signal during the capture cycle of the scan test or the scan-shift clock signal during the initialization cycle (shift-in, shift out) of the scan test.

Hereinafter, the previously described clock gating cell 102a (CG (current)) will be denoted by "an example of a conventional clock gating cell". It is, e.g., characterized by the following truth table (where in Table 1, x denotes either of 0 or 1):

TABLE 1 truth table of a conventional clock gating cell

| FE | SE | clk_o |
|---|---|---|
| 0 | 0 | OFF |
| 1 | x | clk_i |
| x | 1 | clk_i |

Figure 4B:
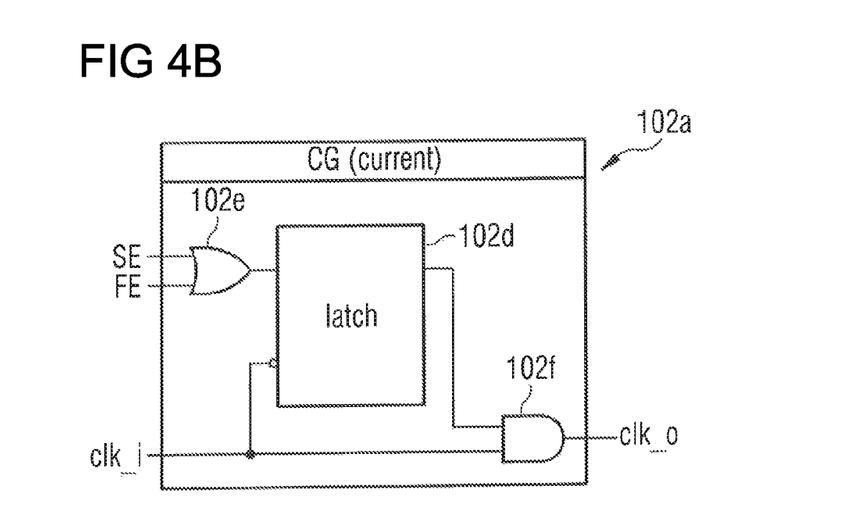
FIG. 4b depicts one possible realization of a clock gating cell.

One particular realization, without being limiting, of a conventional clock gating cell is shown in FIG. 4b: it is assembled by an OR gate 102e, a latch 102d and an AND gate 102f. This conventional clock gating cell is commonly used in test design because the shift-enable signal (SE) is much easier to control by the ATPG tool as compared to the functional-enable signal (FE). In particular, the inclusion of the SE input allows for the enabling of the scan test signal independently of the FE signal. The latch of the particular embodiment of a conventional clock gating cell shown in FIG. 4b is used for the following benefit: as long as the clock signal clk_i=0, the output clock signal (clk_o) is OFF, i.e., clk_o=0. When the clock signal clk_i changes from 0 to 1, the latch holds the state at its D input, reducing timing issues at the clock gating cell. As long as clk_i=1, the output clock signal clk_o is not affected by changes in FE or SE.

Although in the present disclosure, by way of example, a particular conventional clock gating cell is considered, it should by easy matter for a person skilled in the art to replace or adapt the conventional clock gating cell CG (current) by any other type of clock gating cells frequently used in test design. In this sense, the latch in FIG. 4b could, for instance by replaced by a flip-flop, or, in another realization of a conventional clock gating cell, the OR gate could be placed behind the latch. Many minor modifications of the presented realization (FIG. 4b) of a conventional clock gating cell that might be used in the present disclosure, and which are well known to a person skilled in the art.

The scan D flip-flop 102b (scanFF) of the updated clock gating cell in FIG. 4a is controlled by the shift-in (SI) signal during the scan-shift operation. This leads, among others, to greater and easier ATPG controllability, and, hence, higher test coverage, on one hand, and to a reduction of the power consumption during the scan test, on the other. In this particular embodiment, the Q output of the scan flip-flop outputs the scan-shift output (SO) signal.

The combinational logics 102c in the given example include one inverter, two OR gates and two AND gates, connected as shown in FIG. 4a.

The first example updated clock gating cell 12a, CG_1 of the present disclosure possesses six inputs: the clock signal clk_i, the functional-enable signal FE, the shift-enable signal SE, a delay-test-enable signal DT, the scan-shift input signal SI and a reset signal (reset) which resets the scan flip-flop (scanFF) during the scan modes. The updated clock gating cell CG_1 outputs a clock signal clk_o and the scan-shift output (SO) signal. Given the logics of FIG. 4a, the truth table of CG_1 results as given in Table 1:

TABLE 2 truth table of the updated clock gating cell CG_1

| FE | DT | SE | scanFF | clk_o | Note |
|----|----|----|--------|-------|------|
| 0  | 0  | 0  | x      | OFF   | functional operation/capture cycle for low-speed test (e.g., stuck-at) |
| 1  | 0  | 0  | x      | clk_i | functional operation/capture cycle for low-speed test (e.g., stuck-at) |
| x  | x  | 1  | x      | clk_i | test operation (scan shift) |
| x  | 1  | 0  | 0      | OFF   | test operation (at-speed capture) |
| x  | 1  | 0  | 1      | clk_i | test operation (at-speed capture) |

In Table 2, x denotes either of 0 or 1. Furthermore, considering Table 2, one sees that in the phase characterized by DT=0, SE=0 (e.g., in functional operation), the output clock signal clk_o is fully controlled by the functional-enable signal FE. During either of the phases characterized by SE=1 (e.g., the shift phase of the scan test), the updated clock gating cell CG_1 is fully transparent for the clock input signal clk_i, which might, but is not limited to, be the scan-shift clock input signal. During the phase characterized by DT=1, SE=0 (e.g., the at-speed capture cycle), the output clock signal clk_o is controlled by the scan flip-flop (scanFF) which has been set, e.g., by the signal SI in the shift-in cycle of the scan test. In this last phase, clk_i might, for example, be given by the fast/master clock signal. If scanFF=1 the updated clock gating cell CG_1 is fully transparent for the input clock signal clk_i, i.e., clk_o=clk_i as for scanFF=1, while CG_1 is switched off (OFF), whenever scanFF=0, independently of the functional-enable signal during, e.g., the capture cycle of the scan test. By means of the described updated clock gating cell 12a, CG_1, undesired partially enabled clock signals are eliminated at the output clk_o of CG_1.

Figure 5:
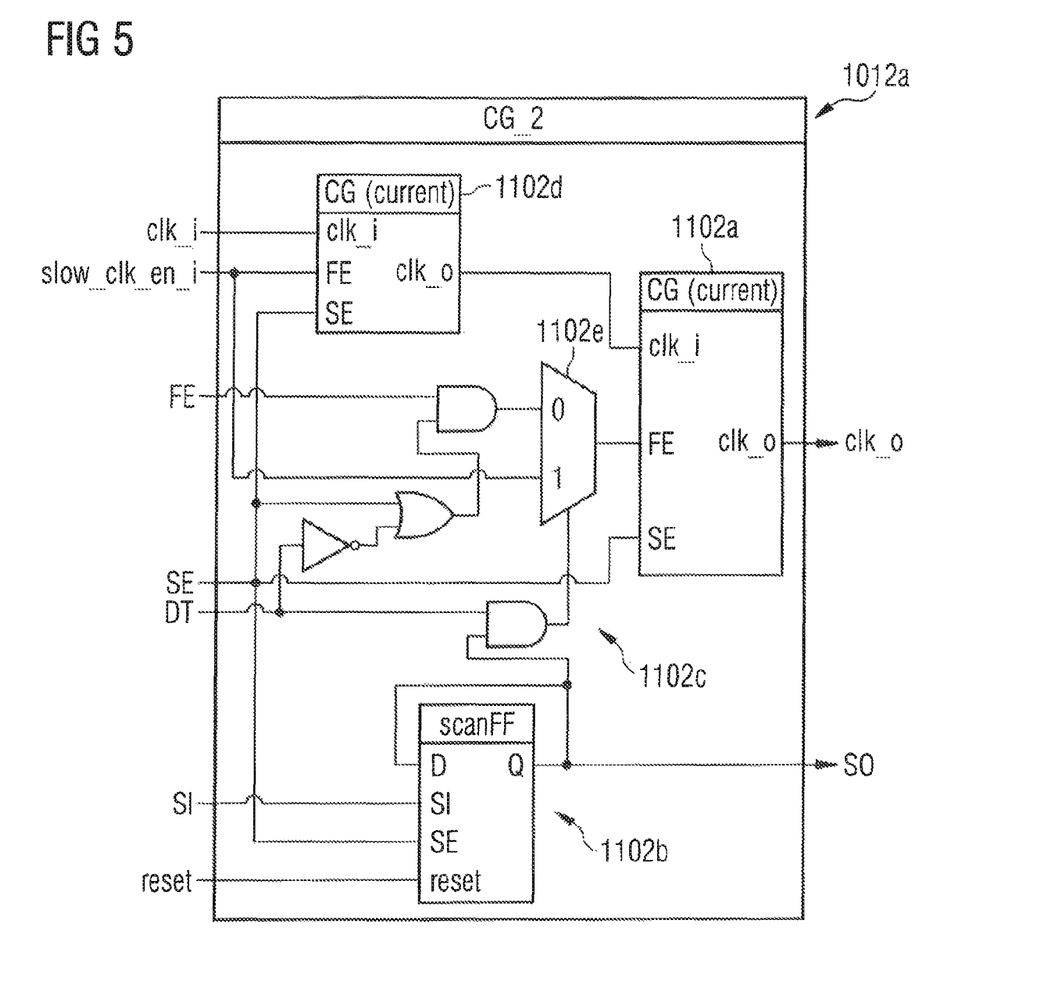
FIG. 5 depicts a second implementation example for an updated clock gating cell.

The second example embodiment, shown in FIG. 5, includes, in addition to the input signals clk_i, FE, SE, DT, SI, reset, introduced in the context of the updated clock gating cell CG_1 of FIG. 4a, an input signal slow_clk_en_i which might, but is not limited to, be the slow-clock enable signal of a digital circuit. The updated clock gating cell 1012a, CG_2 is composed of a first and a second conventional clock gating cell 1102d, 1102a (CG (current), e.g., as, for example, shown in FIG. 4b), as described in the context of the updated clock gating cell 12a (CG_1), a multiplexer 1102e, a scan D flip-flop 1102b (scanFF) and combinational logics 1102c. A system multiplexer/clock gating cell is commonly denoted by "multiplexer-type clock gating cell". The updated clock gating cell CG_2 outputs an output clock signal clk_o and a scan-shift output signal SO.

The updated clock gating cell CG_2 might be used, e.g., if a second clock signal is derived from the fast/master clock signal (e.g., FIG. 3's CCU.fast_clk_o) by use of a slow_clk_en_i signal (e.g., FIG. 3's CCU.slow_clk_en). The first conventional clock gating cell 1102d (CG (current)) in FIG. 5, whose clk_i input is connected with the clk_i signal and whose FE input is connected with the slow_clk_en_in signal generates the desired clock signal. The output of the multiplexer 1102e is connected to the second conventional clock gating cell's 1102a (CG (current)) input FE. Depending on the multiplexer's input signal, either 0 or 1, the multiplexer's output signal is either given by the signal at multiplexer's "0" input or at its "1" input, respectively. The scan flip-flop 1102b (scanFF) is as described in the context of the updated clock gating cell CG_1 in FIG. 4a.

Given the combinational logics of FIG. 5, comprising two AND gates, one OR gate and one inverter, CG_2's truth table is given as in Table 3:

TABLE 3 truth table of the updated clock gating cell CG_2

| FE | DT | SE | slow_clk_en | scanFF | clk_o | Note |
|----|----|----|-------------|--------|-------|------|
| 0  | 0  | 0  | x           | x      | OFF   | functional operation/capture cycle for low-speed test (e.g., stuck-at) |
| 1  | 0  | 0  | x           | x      | clk_i | functional operation/capture cycle for low-speed test (e.g., stuck-at) |
| x  | x  | 1  | x           | x      | clk_i | test operation (scan shift) |
| x  | 1  | 0  | 0           | x      | OFF   | test operation (at-speed capture) |
| x  | 1  | 0  | 1           | 0      | OFF   | test operation (at-speed capture) |
| x  | 1  | 0  | 1           | 1      | clk_i | test operation (at-speed capture) |

The same as in Table 2, x in Table 3 denotes either of 0 or 1. In the phase characterized by DT=0, SE=0 (e.g., in functional operation), the output clock signal clk_o is fully controlled by the functional-enable signal FE. During either of the phases characterized by SE=1 (e.g., the shift phase of the scan test), the updated clock gating cell CG_2 is fully transparent for the clock input signal clk_i, which might, but is not limited to, be the scan-shift clock input signal. During the phase characterized by DT=1, SE=0 (e.g., the at-speed capture cycle), the output clock signal clk_o is controlled by both the slow_clk_en signal and by the scan flip-flop (scanFF) which has been set, e.g., by the signal SI in the shift-in cycle of the scan test: as long as there is no slow_clk_en signal, i.e., slow_clk_en=0, the updated clock gating cell CG_2 is OFF, independently of the status of the scan flip-flop (scanFF). For slow_clk_en=1, the updated clock gating cell CG_2 is fully transparent for the clock signal clk_i, if the scanFF is set, i.e., if scanFF=1, while CG_2 is OFF, if scanFF=0. In one application of the updated clock gating cell CG_2, CG_2 allows for a definition of a slow/divided clock signal at the output of the updated clock gating cell CG_2 by the ATPG tool.

In the same or in other applications each of the updated clock gating cells CG_1 or CG_2 can be individually turned on or switched off once per scan mode depending on the SI signal. By means of this individual control, a reduction of the power consumption during the scan test is possible.

Figure 6:
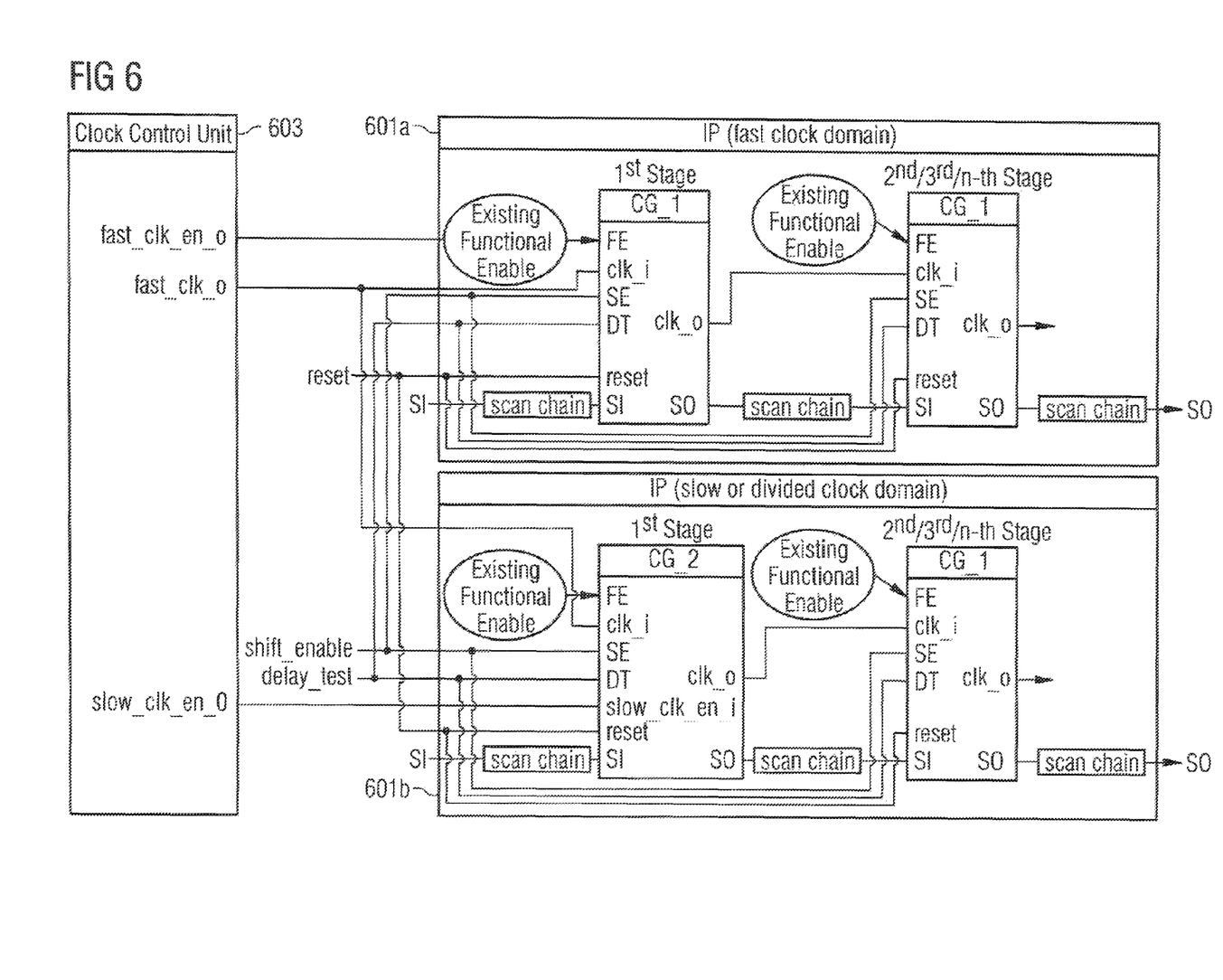
FIG. 6 depicts a IP/top level implementation example including the updated clock gating cells.

FIG. 6 shows an example of a top-level implementation including updated clock gating cells CG_1 or CG_2 according to the descriptions given above. For the sake of concreteness, but without constraining the applicability, a first intellectual property (IP) module 601a, operating in a first (e.g., the fast) clock domain, and a second IP module 601b, operating in a second (e.g., slow or divided) clock domain are shown. Any of the clock signals are generated by a Clock Control Unit 603. The fast clock signal is given by fast_clk_o, while the clock-enable signals for the first IP module 601a and the second IP module 601b are denoted by fast_clk_en_o and slow_clk_en_o, respectively.

The first IP module 601a includes updated clock gating cells, by way of example, of the type CG_1 which have replaced some or all of the conventional clock gating cells, at any stage of the circuit. In addition to the input signals clk_i, FE and SE, present already at the input of the conventional clock gating cell, each updated clock gating cell in the first IP module receives a delay-test-enable signal (delay_test), a scan-shift-input signal (SI) and a reset signal (reset). delay_test=1 defines the at-speed capture cycle of the delay-fault test. The scan-shift input signal is used, amongst others, to turn on or switch off the updated clock gating cells, e.g., by controlling the internal scan flip-flop. Finally, the reset signal (reset) is used to reset an existing system during different scan modes.

The second IP module 601b is composed of, for the sake of concreteness but without being limiting, one updated clock gating cell of the type CG_1, as detailed out above, as a primary stage clock gating cell, and updated clock gating cells of the type CG_2, as described above, as second and higher-stage clock gating cells. In addition to the clk_i, FE, SE, DT, SI and reset input signals, present and discussed already at the input of the updated clock gating cell of the type CG_1, each updated clock gating cell of the type CG_2 in the second IP module receives a slow-clock-enable signal (e.g., slow_clk_en_o) at the input slow_clk_en_i. As described above, the input at slow_clk_en_i only influences the updated clock gating cell's behavior in the case delay_test=1. In this case, the input at slow_clk_en_i determines the waveform of the output clock signal, clk_o, under the condition that the updated clock gating cell is ON. Once the desired waveform of the clock signal is generated, it is sufficient, without being necessary, that the higher-stage (second and higher) updated clock gating cells within a scan chain, being of the type CG_1.

Owing to the behavior of the updated clock gating cells CG_1 and CG_2 given in Table 2 and Table 3, respectively, the output clock signal clk_o at each phase of both functional and test operation is controllable by means of the input signals at each individual updated clock gating cells. In particular, the output clock signal clk_o during the phase with DT=1 (including, but limited to, the capture cycle of the at-speed delay-fault test) is fully controlled by the input clock signal (fast_clk_o) and the clock-enable signals (e.g., fast_clk_en_o, slow_clk_en_o) at each stage of the scan chain. According to the example embodiment shown in FIG. 6, the clock signal during the phase DT=1 defined at the output clk_o of the primary clock gating cells does not change at the higher-stage (second and higher) clock gating cells which are set ON. Furthermore, distorted waveforms of the clock signal, as exemplarily shown in FIG. 1, partially enabled clock signals of cases 3-1, 3-2, 3-3, 7-1, 7-2, 7-3 may be eliminated. Because of the well-defined output clock signal at each updated clock gating cell, the ATPG tool becomes able to define a clock signal at the output of each of these clock gating cells during capture phase, regardless of the functional-enable signal at the input FE. This last implication of the use of updated clock gating cells according to the present disclosure leads, consequently, to an increase of the test coverage. Moreover, since the application of updated clock gating cells allows, amongst others, for the definition of a controllable clock signal for each IP module, the test coverage might be further increased because clock-domain switching may be eliminated or suppressed. In particular, faults occurring in the fast domain being tested in the slow domain (causing test escape; the distorted waveform of the clock signal is shown in FIG. 1, case 3-1), and vice versa (causing test overkill; the distorted waveform of the clock signal is shown in FIG. 1, case 5-1) may be eliminated.

Another benefit of the use of updated clock gating cells may arise due to their individual controllability by a scan flip-flop. The power consumption during the scan test may be reduced by switching on only a reduced number of updated clock gating cells. To reduce power consumption during scan test, an ATPG tool can be given, as a threshold, a maximal number of updated clock gating cells to be turned on during the scan test.

A further benefit of the present disclosure may, e.g., be its fast and easy implementation in circuits, circuit elements, system elements, modules etc.: each conventional clock gating cell can be replaced by one of the updated clock gating cells, CG_1, CG_2, for instance. The replacement of the conventional by updated clock gating cells can be achieved, e.g., by means of automatic engineer change order (ECO) scripts.

While the present disclosure has been described with reference to certain embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular embodiment disclosed, but that the present disclosure will include all embodiments falling within the scope of the appended claims.

What is claimed is:

1. A method for controlling a clock of a scan circuit when performing a scan test, the circuit comprising one or more clock gating cells, the method comprising:
   during a capture cycle of the scan test, generating a sequence of clock pulses;

inputting the sequence of clock pulses into an input of a clock gating cell; and eliminating, by disabling the clock eating cell, an undesired clock pulse from the sequence of clock pulses at a respective output of the clock gating cell to control a number of clock pulses of a clock signal at the output of the clock gating cell.

2. The method of claim 1, wherein the partially enabled clock signal is eliminated to enhance a test coverage of the test.

3. The method of claim 1, wherein the scan test is a structural delay-fault test.

4. The method of claim 1, wherein the one or more clock gating cells during functional, non-test, operation are fully transparent for clock signals.

5. The method of claim 3, further comprising controlling a power consumption to reduce a power consumption during the delay-fault test.

6. The method of claim 5, wherein controlling the power consumption comprises employing a scan flip-flop.

7. The method of claim 1, wherein the scan circuit comprises partially controllable or/and uncontrollable logics.

8. The method of claim 1, wherein the clock system comprises several clock domains.

9. The method of claim 1, further comprising generating the clock signal in a pre-defined form by an automatic test pattern generation (ATPG) tool.

10. A clock gating cell circuit configured to:
during a capture cycle of a structural delay-fault scan test, generate a sequence of clock pulses;
input the sequence of clock pulses into an input of a clock gating cell; and
eliminate, by disabling the clock gating cell, an undesired clock pulse from the sequence of clock pulses to control a number of clock pulses of a clock signal at an output of the clock gating cell.

11. The clock gating cell of claim 10, further comprising a power consumption control configured to reduce a power consumption during the delay-fault scan test.

12. The clock gating cell of claim 11, wherein the power consumption control comprises a scan flip-flop.

13. The clock gating cell of claim 10, further comprising logics configured to derive from an input clock signal an output clock signal, the output clock signal being different from the input clock signal.

14. The clock gating cell of claim 10, further comprising a multiplexer.

15. The clock gating cell of claim 10, further configured to be fully transparent for clock signals during functional, non-test, operation.

16. The clock gating cell of claim 10, further configured to generate the clock signal in a pre-defined form by an automatic test pattern generation (ATPG) tool.

17. A scan circuit comprising one or more clock gating cells, the scan circuit configured to be used for a scan test, wherein:
the one or more clock gating cells is configured to, during the capture cycle of the scan test, generate a sequence of clock pulses, input the sequence of clock pulses into an input of a clock gating cell, and eliminate, by disabling the clock gating cell, an undesired clock pulse from the sequence of clock pulses at a respective output of the clock gating cell to control a number of clock pulses of a clock signal at the output of the clock gating cell.

18. The scan circuit of claim 17, further comprising a power consumption control configured to reduce a power consumption during the delay-fault scan test.

19. The scan circuit of claim 18, wherein the power consumption control comprises a scan flip-flop.

* * * * *